(12) United States Patent
Qi et al.

(10) Patent No.: US 10,554,238 B2
(45) Date of Patent: Feb. 4, 2020

(54) CARRYING CLIP FOR ELECTRONIC DEVICE WITH SPRING TAB

(71) Applicant: HYTERA COMMUNICATIONS CORP., LTD., Shenzhen, Guangdong (CN)

(72) Inventors: Xiangru Qi, Shenzhen (CN); Jingguang Peng, Shenzhen (CN)

(73) Assignee: Hytera Communications Corporation Limited (CN)

( * ) Notice: Subject to any disclaimer, the term of this patent is extended or adjusted under 35 U.S.C. 154(b) by 2 days.

(21) Appl. No.: 15/752,475

(22) PCT Filed: Aug. 14, 2015

(86) PCT No.: PCT/CN2015/086932
§ 371 (c)(1),
(2) Date: Dec. 4, 2018

(87) PCT Pub. No.: WO2017/028004
PCT Pub. Date: Feb. 23, 2017

(65) Prior Publication Data
US 2019/0097666 A1    Mar. 28, 2019

(51) Int. Cl.
*H04M 1/00* (2006.01)
*H04B 1/3877* (2015.01)
(Continued)

(52) U.S. Cl.
CPC ............ *H04B 1/3877* (2013.01); *A45F 5/02* (2013.01); *H04M 1/06* (2013.01); *A45F 2200/0516* (2013.01)

(58) Field of Classification Search
CPC .......... H04B 1/3877; A45F 5/02; A45F 5/021; H04M 1/04; H04M 1/06; H05K 5/0204
See application file for complete search history.

(56) References Cited

U.S. PATENT DOCUMENTS 3,583,734 A    6/1971  Magi
3,586,355 A    6/1971  Magi
(Continued)

FOREIGN PATENT DOCUMENTS

CN    2764079       3/2006
CN    2798678 Y     7/2006
CN    204948549 U   1/2016

OTHER PUBLICATIONS

English Translation of International Search Report from PCT/CN2015/086932 dated May 10, 2016 (10 pages).

*Primary Examiner* — Pakee Fang
(74) *Attorney, Agent, or Firm* — Calfee, Halter & Griswold LLP

(57) ABSTRACT

A carrying clip for an electronic device includes a first clip body, a second clip body, and a spring tab; the first clip body is provided with a snap ring on which a notch is provided; the second clip body is rotatably connected to the first clip body and is provided with a groove, the snap ring of the first clip body is snapped and assembled in the groove of the second clip body and is rotatable along the wall surface of the groove, the wall surface of the groove is uniformly formed with a plurality of snapping slots; the spring tab comprises an annular spring tab body and a protrusion projected on the spring tab body, the spring tab body is snapped and assembled in the snap ring of the first clip body, the protrusion projects out of the notch of the snap ring and abuts against the wall surface of the groove of the second clip body; when the first clip body rotates with respect to the second clip body, the protrusion of the spring tab rotates along the wall surface of the groove alternatively abuts against the snapping slots or non-snapping slots of the wall surface of the groove so as to form stages.

19 Claims, 7 Drawing Sheets

(51) Int. Cl.
*A45F 5/02* (2006.01)
*H04M 1/06* (2006.01)

(56) References Cited

U.S. PATENT DOCUMENTS

| | | |
|---|---|---|
| 2003/0016251 A1 | 8/2003 | Kim |
| 2006/0166722 A1* | 7/2006 | Gu .................... H04B 1/385 |
| | | 455/575.8 |
| 2016/0290427 A1* | 10/2016 | Huang .................... F16F 3/00 |

* cited by examiner though their centers do not coincide with each other, an arcuate notch or raised edge is arranged at the position on the inner wall surface or the outer wall surface close to the protrusion.

CARRYING CLIP FOR ELECTRONIC DEVICE WITH SPRING TAB

TECHNICAL FIELD

The present disclosure relates to the field of electronic products, and more particularly, to a carrying clip for an electronic device.

BACKGROUND

With continuous popularization of electronic devices (such as an interphone, etc.), users raise increasingly higher requirements on the portability of the electronic devices.

In the prior art, many portable electronic devices, such as the interphone, are provided with a carrying clip for facilitating carrying. The carrying clip usually comprises: a housing body for snapping and assembling the interphone and a belt fastener installed on the housing body, the belt fastener can be hanged on the belt, so that the electronic device is fixed on the belt when it is not used, thus increasing the portability of the electronic device.

The electronic device usually has a certain length, and especially, the electronic device like the interphone is further provided with an antenna. Therefore, its length can be longer, and when the electronic device is fixed on the belt around the waist, if the user bends down or crouches, the electronic device or the antenna can come into contact with user body, and make the user feel uncomfortable.

Therefore, a rotational carrying clip is generated at the right moment. Referring to FIG. 1, a belt fastener 4a of a rotational carrying clip in the prior art is provided with a support 41a, a housing body 2a is fixed with a back clip 21a, the back clip 21a and the support 41a are correspondingly provided with a riveting hole, and the two are riveted by a rivet 3a to rotate relatively. Meanwhile, a circular limiting protrusion 411a is arranged around the riveting hole in the surface of the support 41a facing the back clip 21a by every 45 degrees, a circular snapping slot 211a is arranged around the riveting hole at a side of the back clip 21a facing the support 41a by every 45 degrees, a plurality of limiting protrusions 411a on the support 41a are correspondingly snapped into a plurality of snapping slots 211a on the back clip 21a, the other side of the support 41a back to the protrusions 411a is provided with a positive-pressing spring tab 6a, and the two sides of the positive-pressing spring tab 6a hunch up. Therefore, when the positive-pressing spring tab 6a is pressed by a rivet fixing the positive-pressing spring tab 6a, the positive-pressing spring tab 6a will generate an elastic force that presses the limiting protrusion 411a on the support in the snapping slots 211a of the back clip 21a by a certain prestressing force, when a certain external force is applied to overcome the elastic force of the positive-pressing spring tab 6a to rotate the housing body 2a, the limiting protrusion 411a on the support 41a is separated from the snapping slot 211a on the back clip 21a, and when the limiting protrusion 411a rotates to next snapping slot 211a, the limiting protrusion 411a easily slips into next snapping slots 211a due to the elastic force application of the positive-pressing spring tab 6a, so as to generate stage feeling.

However, the carrying clip structure using positive-pressing spring tab to assemble by riveting is complicated, and the cost is high. Moreover, since the carrying clip mainly obtains the prestressing force by the hunch-up part of the surface of the positive-pressing spring tab, and the prestressing force of the hunch-up part depends on the tightness of the rivet, if the tightness in the assembly process deviates slightly, a rotating torsion may be too large or too little, which causes that the rotating torsion is difficult to be controlled, and the user experience is greatly affected.

SUMMARY

A technical problem to be solved by the present disclosure is to provide a carrying clip for an electronic device which is simple in structure, low in cost, and is easily controlled by rotating torsion.

In order to solve the technical problem above, the present disclosure provides a carrying clip for an electronic device, comprising:

a first clip body provided with a snap ring on which a notch is provided;

a second clip body rotatably connected to the first clip body and provided with a groove, wherein the snap ring of the first clip body is snapped and assembled in the groove of the second clip body and is rotatable along the wall surface of the groove, the wall surface of the groove is uniformly formed with a plurality of snapping slots; and a spring tab comprising an annular spring tab body and a protrusion projected in the spring tab body, wherein the spring tab body is snapped and assembled in the snap ring of the first clip body, the protrusion projects out of the notch of the snap ring and abuts against the wall surface of the groove of the second clip body.

The spring tab is made of elastic plastic materials, when the first clip body rotates with respect to the second clip body, the protrusion of the spring tab rotates along the wall surface of the groove to alternatively abut against the snapping slots or non-snapping slots of the wall surface of the groove so as to form stages.

Preferably, the material thickness of the part of the spring tab body close to the protrusion becomes thinner uniformly from far to near according to the distance between the spring tab body and the protrusion.

Preferably, the spring tab body is an eccentric strap, both the inner wall surface and the outer wall surface of the spring tab body are circular, and the circular center of the inner wall surface deviates from the circular center of the outer wall surface to the direction close to the protrusion, and is located at a connecting line between the circular center of the outer wall surface and the center of the protrusion.

Preferably, the eccentricity ratio of the spring tab body is within the range of 2%-10%.

Preferably, the outer wall surface of the spring tab body is a circular surface, the half wall surface of the inner wall surface of the spring tab body close to the protrusion is an oval wall surface, the half wall surface keeping away from the protrusion is a circular wall surface, and the oval wall surface of the inner wall surface and the circular wall surface are in smooth transition.

Preferably, the inner wall surface and the outer wall surface of the spring tab body are both oval surfaces, the center of the inner wall surface deviates from the center of the outer wall surface to the direction close to the protrusion, and is located at a connecting line between the center of the outer wall surface and the center of the protrusion, the long axis of the outer wall surface is located at the connecting line between the center of the outer wall surface and the center of the protrusion, and the short axis of the outer wall surface is vertical to the connecting line between the center of the outer wall surface and the center of the protrusion.

Preferably, the inner wall surface and the outer wall surface of the spring tab body are homocentric circular rings, and the thickness of the spring tab body becomes thinner uniformly from the part keeping away from the protrusion to the part close to the protrusion along the surface width direction of the inner wall surface or the outer wall surface of the spring tab body.

Preferably, a limiting structure for limiting the relative rotation of the spring tab body and the snap ring is arranged between the part of the spring tab body keeping away from the protrusion and the snap ring. Preferably, the limiting structure comprises a limiting groove and a limiting block which are respectively arranged between the spring tab body and the snap ring and matched with each other.

Preferably, the limiting block is arranged in the spring tab body and is located at the relative position of the protrusion, the limiting groove is formed in the snap ring and is located at the relative position of the notch, and the limiting groove penetrates through the snap ring, so that the snap ring is separated into two relatively arranged arc sections by the notch and the limiting groove.

Preferably, the non-snapping slots of the groove wall surface are multiple sections of homocentric arc surfaces with the same diameter, the wall surfaces of all the snapping slots are arc surfaces with the same size, and the arc center of the non-snapping slot of the groove overlaps with the center of the spring tab body and is located at a center of rotation of the first clip body and the second clip body. Preferably, the first clip body and the second clip body are both made of plastic materials.

Compared with the prior art, the present disclosure has the following beneficial effects.

According to the carrying clip for an electronic device of the present disclosure, the protrusion of the spring tab is adopted to be abutted against the wall surface of the groove with multiple snapping slots, so that the spring tab is alternatively compressed by different degrees to form a well-bedded stage feeling, which is simple in structure and low in cost. Moreover, the elastic force of the spring tab is related to the shape and material of the spring tab and the shape of the groove, and is not related to the assembly process. Therefore, the rotating torsion is easy to control, avoiding the phenomenon that the same product has different rotating torsions caused by assembly. In addition, since the spring tab is made of elastic plastic materials, the spring tab is good in tenacity and abrasive resistance, and long lasting in service life, so that the carrying clip for an electronic device keeps a constant rotating torsion.

Figure 1:
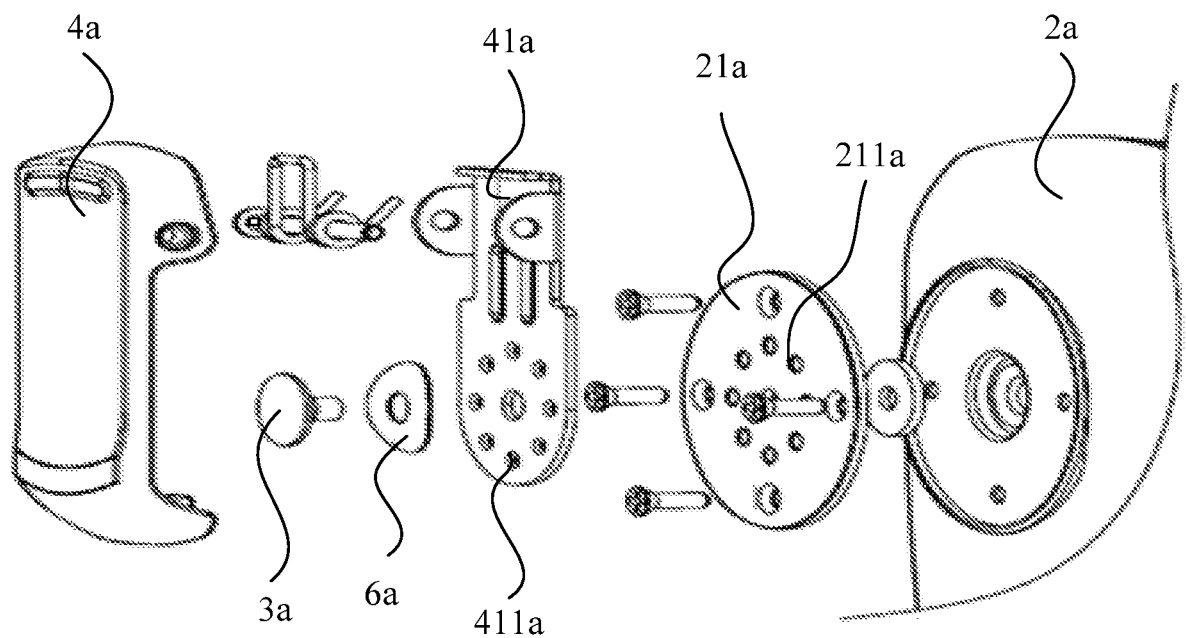
FIG. 1 is a structural exploded view of a carrying clip for an electronic device in the prior art.
Figure 2:
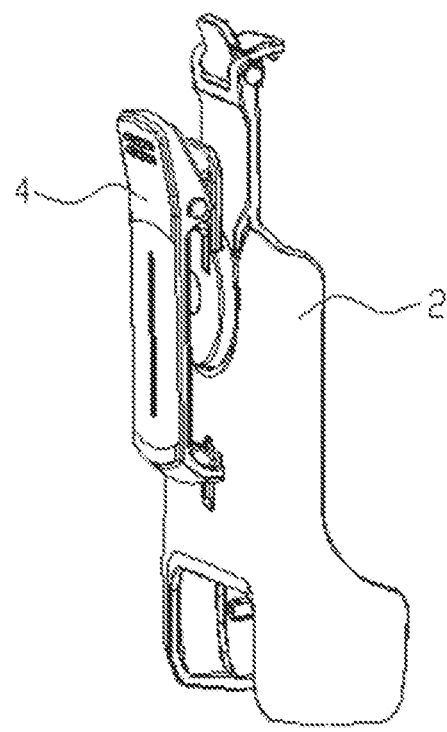
FIG. 2 is an overall structural schematic diagram of a carrying clip for an electronic device according to a first preferred embodiment of the present disclosure.
Figure 3:
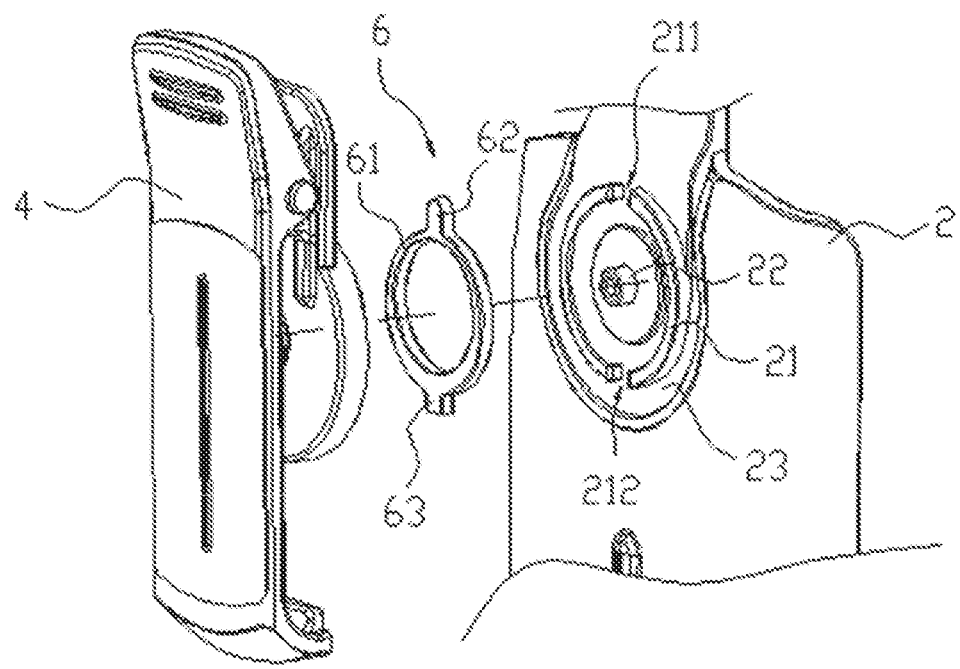
FIG. 3 is an exploded view 1 of the carrying clip for an electronic device according to the first preferred embodiment of the present disclosure.
Figure 4:
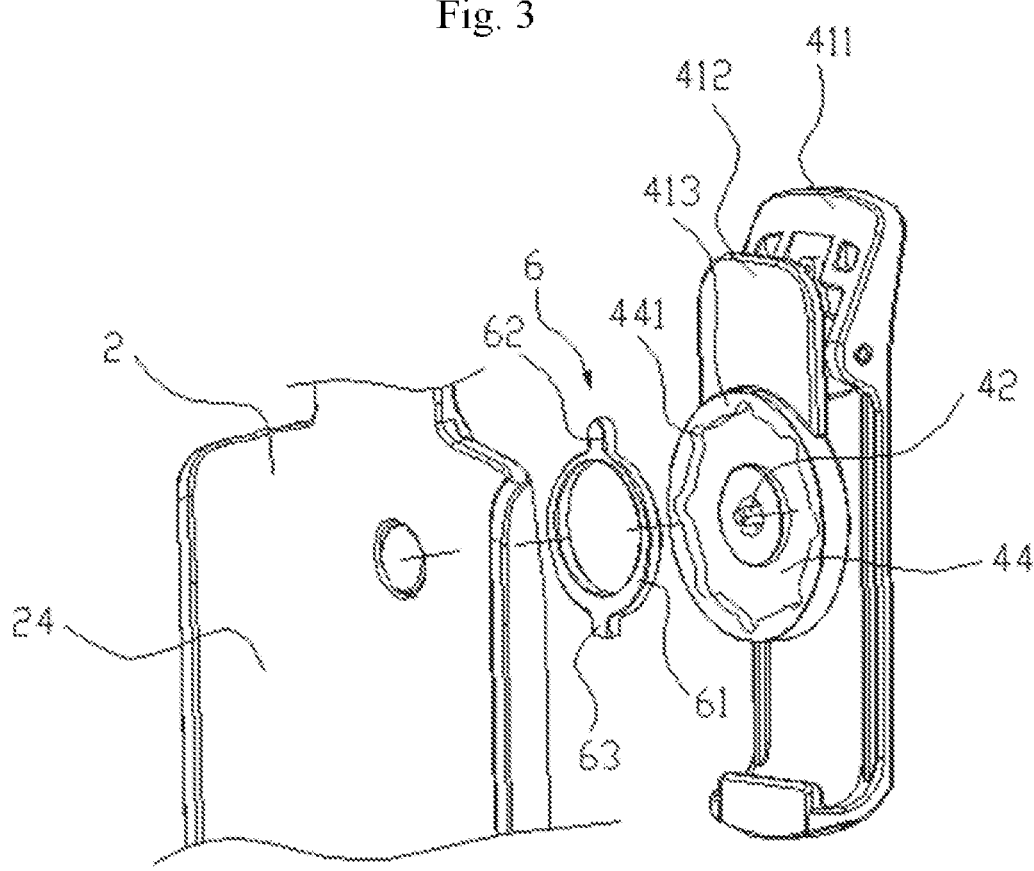
FIG. 4 is an exploded view 2 of the carrying clip for an electronic device according to the first preferred embodiment of the present disclosure.
Figure 5:
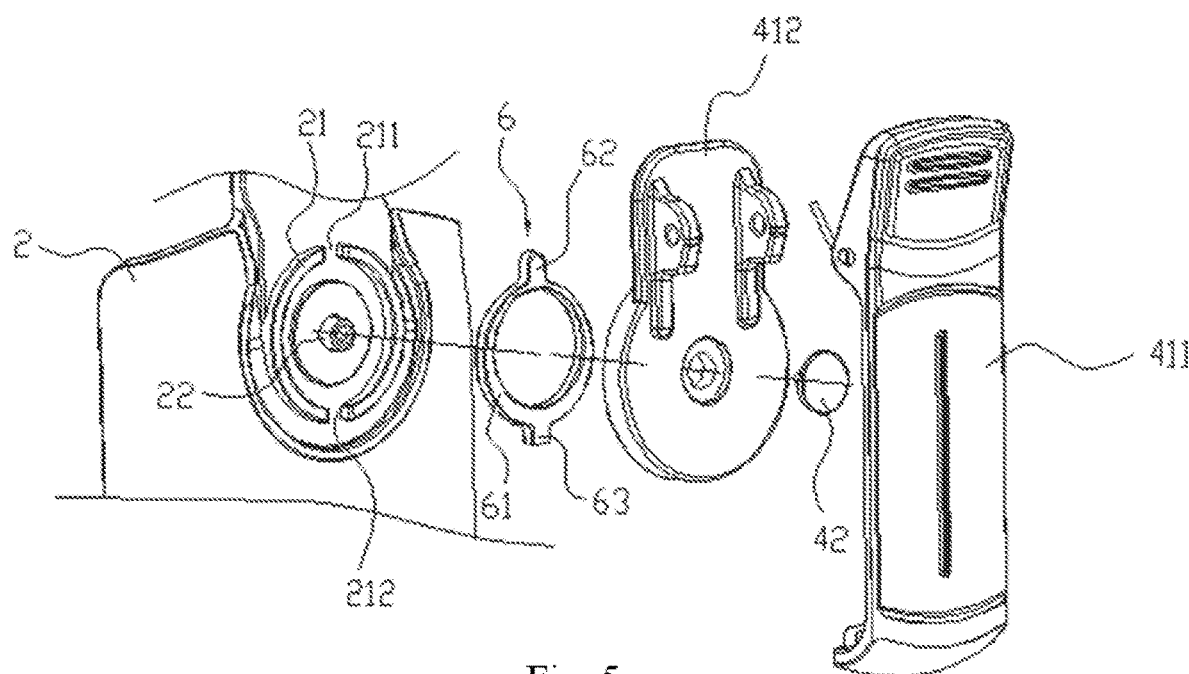
FIG. 5 is an exploded view 3 of the carrying clip for an electronic device according to the first preferred embodiment of the present disclosure.

The numeral references are as follows: 2a refers to a housing body, 21a refers to a back clip, 211a refers to a snapping slot, 3a refers to a rivet, 4a refers to a belt fastener, 41a refers to a support, 411a refers to a limiting protrusion, 6a refers to a positive-pressing spring tab, 2 refers to a first clip body, 21 refers to a snap ring, 211 refers to a notch, 212 refers to a limiting groove, 213 refers to a limiting block, 22 refers to a first fixed pin, 23 refers to a holding tank, 24 refers to a holding chamber, 4 refers to a second clip body, 411 refers to a belt fastener, 412 refers to a support, 413 refers to a boss, 42 refers to a second fixed pin, 44 refers to a groove, 441 refers to a snapping slot, 6 refers to a spring tab, 61 refers to a spring tab body, 611 refers to an inner wall surface, 6111 refers to a circular wall surface, 6112 refers to an oval wall surface, 612 refers to an outer wall surface, 62 refers to a protrusion, and 63 refers to a limiting block.

DETAILED DESCRIPTION

In order to further describe the principle and structure of the present disclosure, the preferred embodiments of the present disclosure are described in detail now with reference to the drawings. Referring to FIG. 2, FIG. 3, FIG. 4 and FIG. 5, a carrying clip for an electronic device according to a first embodiment of the present disclosure comprises a first clip body 2, a second clip body 4 and a spring tab 6.

The electronic device of the present disclosure may be an interphone, a mobile phone or an electronic device of other types in actual application, which is not specifically limited here.

Any one of the first clip body 2 and the second clip body 4 can be used as a housing body for snapping, assembling and containing the electronic device, and the other one can be used as a belt clip, so that the electronic device is fixed in the belt when the electronic device is not used, thus increasing the portability of the electronic device.

The first clip body 2 is used as the housing body for snapping, assembling and containing the electronic device in the embodiment, and is provided with a holding chamber 24 for containing the electronic device. The second clip body 4 is used as the belt clip, which includes a belt fastener 411 and a support 412, the belt fastener 411 is hinged with the support 412 through a hinge pin, and a torsional spring is sleeved on the hinge pin to clamp an elastic clip of the belt fastener 411 on the support 412.

The first clip body 2 can be rotationally connected to the second clip body 4.

Specifically, the first clip body is provided with a through hole, a first fixed pin 22 is installed in the through hole, the support 412 of the second clip body 4 is also provided with a through hole, a second fixed pin 42 is installed in the through hole, the supports 412 of the first clip body 2 and the second clip body 4 are butted and fixed with the second fixed pin 42 through the first fixed pin 22 to be rotationally assembled together, and the first fixed pin 22 and the second fixed pin 42 are butted to form a central spindle, so that both the first clip body 2 and the second clip body 4 can rotate around the central spindle. In other embodiments, the rotational connection structure of the first clip body 2 and the second clip body 4 is not limited to the connecting form of the fixed pin, a structure that a fixed column is matched with a through hole, or a structure that a bolt is matched with a through hole can also be used.

It can be understood that, in actual application, more modes commonly known in the prior art can be used between the first clip body 2 and the second clip body 4 to form a rotational connecting structure, which is not specifically limited here.

The first clip body 2 is provided with a snap ring 21 on which a notch 211 is provided.

The second clip body 4 is provided with a groove 44, and the wall surface of the groove 44 is uniformly formed with a plurality of snapping slots 441.

Further, the support 412 of the second clip 4 is provided with a boss 413, and the groove 44 is formed on the boss 413; and the first clip body 2 sinks downwardly at a side facing the second clip body 4 to form a holding tank 23 for containing the boss 413, and the snap ring 21 is located in the holding tank 23.

The spring tab 6 is made of elastic plastic materials, and includes an annular spring tab body 61 and a protrusion 62 projected in the spring tab body 61.

Figure 6A:
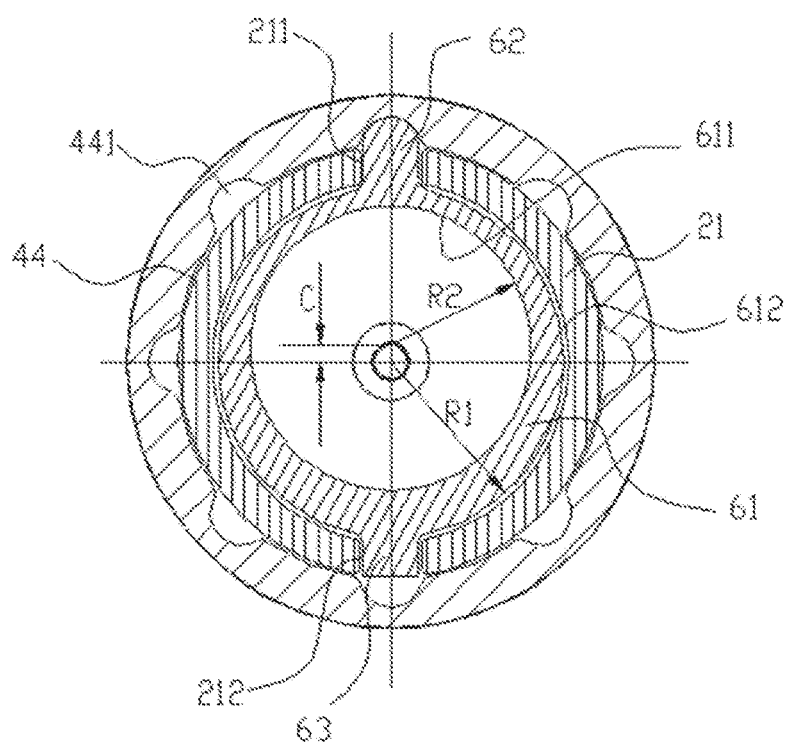
FIG. 6A is a sectional view of a spring tab rotating into a gear of the carrying clip for an electronic device according to the first preferred embodiment of the present disclosure.
Figure 6B:
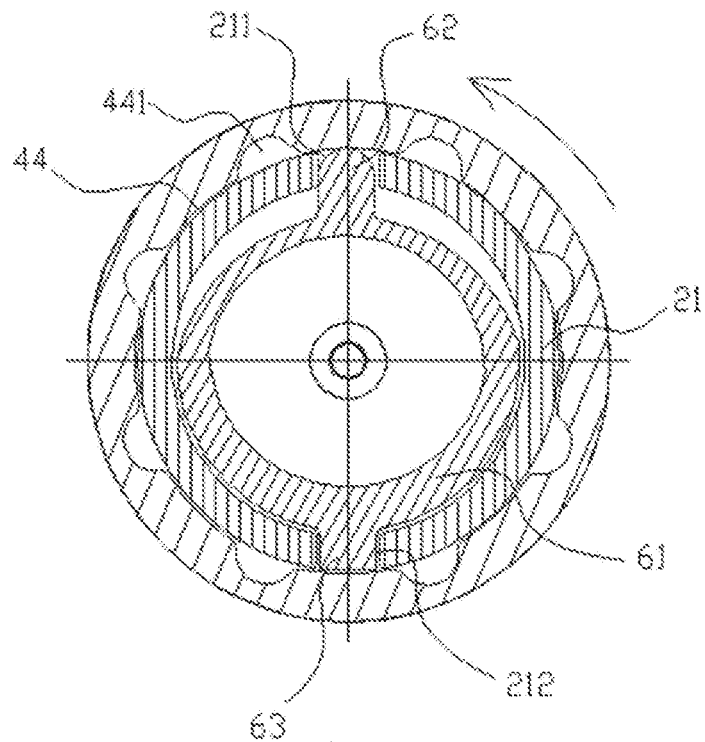
FIG. 6B is a sectional view of the spring tab rotating in a state not entering the gear of the carrying clip for an electronic device according to the first preferred embodiment of the present disclosure.

Referring to FIG. 6A and FIG. 6B, when the first clip body 2 is assembled together with the second clip body 4, the snap ring 21 of the first clip body 2 is snapped and assembled in the groove 44 of the second clip body 4, and can rotate along the wall surface of the groove 44, the spring tab body 61 is snapped and assembled in the snap ring 21 of the first clip body 2, and the protrusion 62 projects out of the notch 211 of the snap ring 21 and abuts against the wall surface of the groove 44 of the second clip body 4. When the first clip body 2 rotates with respect to the second clip body 4, the protrusion 62 of the spring tab 6 rotates along the wall surface of the groove 44 to alternatively abut against the snapping slots 441 or non-snapping slots of the wall surface of the groove 44, when the protrusion 62 rotates to the non-snapping slots between two snapping slots 441, the protrusion 62 is squeezed by the wall surface of the groove 44 to deform to the inner chamber direction of the snap ring 21, at the moment, the spring tab 6 is in a prepressing state, the extrusion force between the protrusion 62 and the wall surface of the groove 44 is relatively large, so that the external force used to overcome the extrusion force to drive the first clip body 2 to rotate relative to the second clip body 4 is relatively large; and when the protrusion 62 further rotates to the next snapping slot 441, the spring tab naturally extends under the effect of the elasticity, the elasticity of the spring tab 6 is gradually decreased after recovery of the deformation, so that the extrusion force between the protrusion 62 and the wall surface of the groove 44 is also gradually decreased, so as to gradually decrease the external force that overcomes the extrusion force to drive the first clip body 2 to rotate relative to the second clip body 4. Therefore, when the first clip body 2 rotates relative to the second clip body 4, the protrusion 62 alternatively abuts against the snapping slots 441 or non-snapping slots of the wall surface of the groove 44, so as to form a well-bedded hand feeling to obtain a stage feeling.

Since the spring tab 6 is made of the elastic plastic materials, the elasticity of the spring tab 6 depends on the material of the spring tab 6 on one hand, and depends on the shape of the spring tab 6 and the deformation degree of the spring tab in rotational process on the other hand, so that on the premise that the material of the spring tab 6 and the shape of the spring tab 6 are determined, the elasticity of the spring tab 6 only depends on the deformation degree of the spring tab 6 in the rotational process, and the deformation degree of the spring tab 6 in the rotational process depends on the shape of the groove 44. Therefore, when the shape of the groove 44 is determined, the elasticity of the spring tab 6 is determined. The material of the spring tab 6, the shape of the spring tab 6 and the shape of the groove 44 are not affected by the assembly process of the product. Therefore, the assembly process of the product cannot affect the elasticity of the spring tab 6, so that the rotating torsion is easy to be controlled without being affected by the assembly process, which also guarantees that the rotating torsions of all products are the same, thus avoiding the phenomenon that the rotating torsion of different products may be large or small. Next, the spring tab 6 made of elastic plastic materials is good in tenacity and abrasive resistance, and is long lasting in service life. Even if the spring tab 6 is used for a long time, the elasticity of the spring tab 6 cannot be changed greatly, so as to enable the carrying clip for an electronic device to keep constant rotating torsion.

In the embodiment, the spring tab 6 is made of PC material, that is polycarbonate, which has features like high strength and elastic coefficient, high impact strength, and the like, the spring tab 6 is good in fatigue durability and long lasting in service life, and can enable the carrying clip for an electronic device to keep constant rotating torsion. In other embodiments, the spring tab 6 can also be made of PC/ABS material, which is the mixture of two materials of PC and ABS, wherein PC refers to polycarbonate and ABS refers to a copolymer of acrylonitrile (A), butadiene (B) and styrene (S), PC/ABS material has better flexibility, higher impact resistance and hardness, and long lasting service life. In addition, the spring tab 6 can also be made of PA material. that is, polyamide,commonly known as nylon, PA material is good in wear resistance and self lubricity, and low in friction coefficient, and is smooth while being used as the spring tab, with good user experience.

It can be understood that, in actual application, the spring tab 6 can be made of other elastic plastic materials commonly known in the prior art, which is not illustrated one by one here.

Preferably, the first clip body 2 and the second clip body 4 are also made of plastic materials, so that the spring tab 6 is made of a similar material as the first clip body 2 and the second clip body 4 with the same hardness basically, thus avoiding the mutual abrasion between the spring tab 6 and the wall surface of the groove 44 to reduce the smoothness of the sliding of the spring tab 6. Secondary, the spring tab 6, the first clip body 2 and the second clip body 4 are all made of plastic materials, and there will be no corrosion even if exposed to water stain and sweat stain in a long term, so that the tab 6, the first clip body 2 and the second clip body 4 can keep novel and beautiful appearance for long time.

In a preferred embodiment, a limiting structure for limiting the relative rotation of the spring tab body 61 and the snap ring 21 is arranged between the part of the spring tab body 61 keeping away from the protrusion 62 and the snap ring 21, the limiting structure and the notch 211 of the snap ring 21 respectively limit the two ends of the spring tab 6 to prevent the spring tab 6 and the snap ring 21 from rotating relatively, so as to cause the distortion of the spring tab 6, affect the stability of the elasticity, and even lead to rotation snapping.

During specific implementation, the limiting structure for limiting relative rotation of the spring tab body 61 and the snap ring 21 can be as follows. An installation hole is arranged between the part of the spring tab body 61 keeping away from the protrusion 62 and the snap ring 21, and the part of the spring tab body 61 keeping away from the protrusion 62 is fixed with the snap ring 21 through a screw, a bolt and other fasteners.

Figure 10:
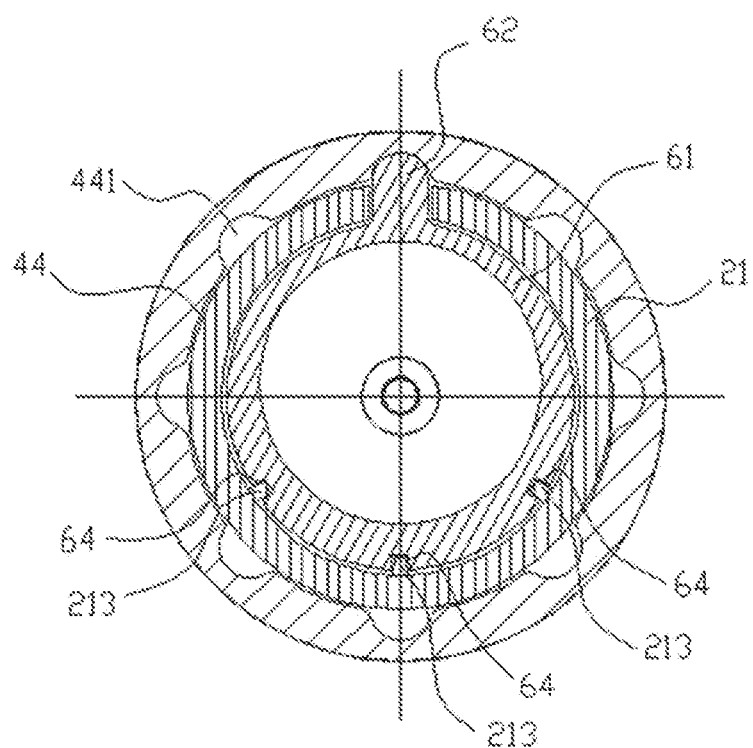
FIG. 10 is a sectional view of a spring tab matched with a snap ring and a groove of a carrying clip for an electronic device according to a fifth preferred embodiment of the present disclosure.

Referring to FIG. 10, and in a preferred embodiment, the limiting structure for limiting the relative rotation of the spring tab body 61 and the snap ring 21 includes a limiting groove 64 and a limiting block 213 which are respectively arranged between the spring tab body 61 and the snap ring 21 and matched with each other. During actual application, the limiting groove 64 can be arranged in the spring tab body 61, and the limiting block 213 is arranged in the snap ring 21. The limiting groove 64 can also be arranged in the snap ring 21, and the limiting block 213 is arranged in the spring tab body 61. In addition, when the limiting strength of a pair of the limiting groove 64 and the limiting block 213 limiting the relative rotation of the spring tab 6 and the snap ring 21 is insufficient, multiple pairs of the limiting grooves 64 and the limiting blocks 213 can be added to limit the relative rotation of the spring tab 6 and the snap ring 21.

Referring to FIG. 6A and FIG. 6B, and in a preferred embodiment, the limiting structure for limiting the relative rotation of the spring tab body 61 and the snap ring 21 includes a limiting groove 212 and a limiting block 63 which are respectively arranged between the spring tab body 61 and the snap ring 21 and matched with each other, wherein the limiting block 63 is arranged in the spring tab body 61 and is located at the position relative to the protrusion 62, the limiting groove 212 is formed in the snap ring 21 and is located at the position relative to the notch 211, and the limiting groove 212 passes through the snap ring 21, so that the snap ring 21 is separated into two relatively arranged arc sections by the notch 211 and the limiting groove 212.

In a preferred embodiment, the material thickness of the part of the spring tab body 61 close to the protrusion 62 becomes thinner uniformly from far to near according to the distance between the spring tab body 61 and the protrusion 62, so as to facilitate the deformation of the spring tab 6 and the reduction of the rotating torsion, and enable user operation to be easier. In addition, the material thickness (the thickness of the material used) of the part of the spring tab body 61 close to the protrusion 62 becomes thinner uniformly from far to near according to the distance between the spring tab body 61 and the protrusion 62, and can enable the spring tab 6 to partially deform at the part of the spring tab body 61 close to the protrusion 62 in deformation, and the part of the spring tab body 61 keeping away from the protrusion 62 hardly deforms due to relatively wide material thickness. Therefore, the spring tab body 61 can keep the entire appearance in the rotational process, thus avoiding the unstable rotating torsion caused by overlarge deformation.

Referring to FIG. 6A, and in a preferred embodiment, the material thickness of the part of the spring tab body 61 close to the protrusion 62 becoming thinner uniformly from far to near according to the distance between the spring tab body 61 and the protrusion 62 is implemented through the following structure. The spring tab body 61 is an eccentric strap, the inner wall surface 611 and the outer wall surface 612 are both circles, the radius of the outer wall surface 612 is R1, the radius of the inner wall surface 611 is R2, the circular center of the inner wall surface 611 deviates from the circular center of the outer wall surface 612, and the circular center of the inner wall surface 611 deviates from the circular center of the outer wall surface 612 along a connecting line with the center of the protrusion 62, so that the material thickness of the spring tab body 61 becomes thinner uniformly from far end of the protrusion 62 to the near end of the protrusion, thus avoiding the stress concentration of the spring tab 6 caused by uneven material thickness, which further leads to the fracture, enables the part of the spring tab 6 close to the protrusion 62 to deform more easily, reduces the rotating torsion, and makes the operation of user be easier.

Further, the eccentricity ratio of the spring tab body 61 is preferably within the range of 2%-10% to guarantee the proper elasticity of the spring tab 6, so that the user has obvious stage feeling in operation without feeling strenuous to rotate due to overlarge torsion. Specifically, in the embodiment, the radius R2 of the inner wall surface 611 of the spring tab body 61 is about 14.5mm, the radius R1 of the outer wall surface 612 is about 18 mm, the circular center of the inner wall surface 611 deviates from the circular center of the outer wall surface 612 in a distance C of about 0.7 mm, and the eccentricity ratio of the spring tab body 61=E=C/R1=3.89%.

Figure 7:
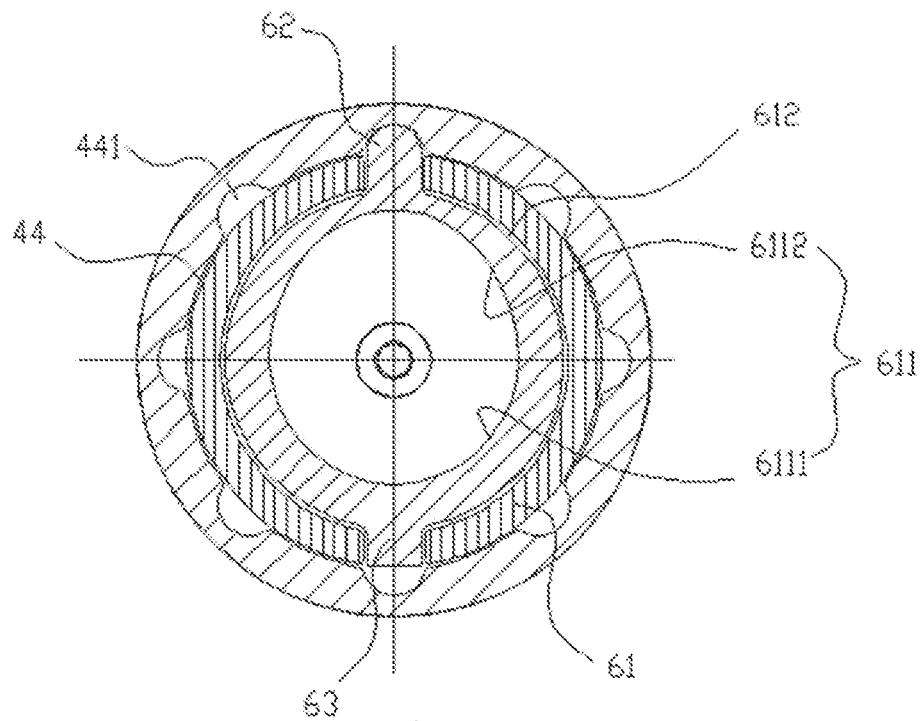
FIG. 7 is a sectional view of a spring tab matched with a groove of a carrying clip for an electronic device according to a second preferred embodiment of the present disclosure.

In another embodiment, the solution of the uniform change of the material thickness of the spring tab body 61 can also be implemented through the following structure; referring to FIG. 7, the outer wall surface 612 of the spring tab body 61 is a circular surface, the half wall surface of the inner wall surface 611 of the spring tab body 61 close to the protrusion 62 is an oval wall surface 6112, the half wall surface keeping away from the protrusion 62 is a circular wall surface 6111, and a short axis of the oval wall surface 6112 is equal to the radius of the circular wall surface 6111, so that the oval wall surface 6112 and the circular wall surface 6111 are in smooth transition. The structure can also enable the part of the spring tab 6 close to the protrusion 62 to deform more easily, so that it is easy for the user to operate.

Figure 8:
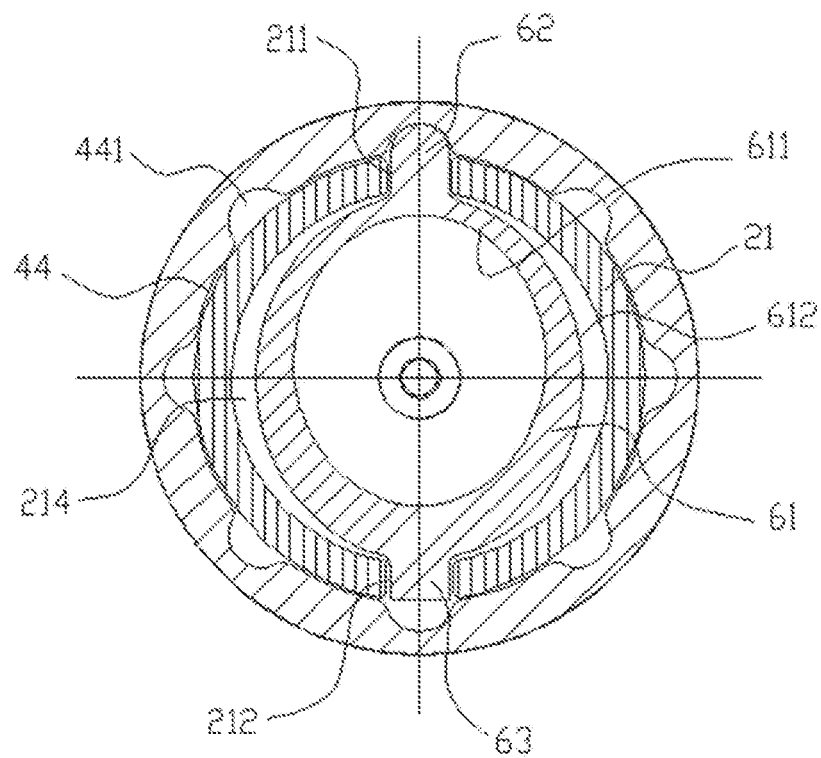
FIG. 8 is a sectional view of a spring tab matched with a snap ring and a groove of a carrying clip for an electronic device according to a third preferred embodiment of the present disclosure.

In another embodiment, the solution of the uniform change of the material thickness of the spring tab body 61 can also be implemented through the following structure; referring to FIG. 8, the inner wall surface 611 and the outer wall surface 612 of the spring tab body 61 are both oval surfaces, the center of the inner wall surface 611 deviates from the center of the outer wall surface 612 to the direction close to the protrusion 62, and is located at a connecting line between the center of the outer wall surface 612 and the center of the protrusion 62, the long axis of the outer wall surface 612 is located at the connecting line between the center of the outer wall surface 612 and the center of the protrusion 62, and the short axis of the outer wall surface 612 is vertical to the connecting line between the center of the outer wall surface 612 and the center of the protrusion 62, so that when the spring tab 6 is snapped and assembled in the snap ring 21, two ends of the long axis of the spring tab body 61 can fully abut against the snap ring 21, and the protrusion 62 on the spring tab 6 stretches out from the notch 211 of the snap ring 21 to abut against the wall surface of the groove 44, and a gap 214 is formed between the position of the short axis of the spring tab body 61, the gap 214 provides a directed and quantitative deformation space for the spring tab 6, so that the spring tab 6 has more regular and stable elastic change in the rotational process, so as to obtain more regular and stable rotating torsion to improve the user experience. In three embodiments shown in FIG. 6A, FIG. 6B, FIG. 7 and FIG. 8, the change of material thickness of the spring tab body 61 is reflected in the thickness change between the inner wall surface 611 and the outer wall surface 612 of the spring tab body 61. In other embodiments, the change of material thickness of the spring tab body 61 can also be reflected in the change of thickness in the surface width direction of the inner wall surface 611 and the outer wall surface 612 of the spring tab body 61.

Figure 9A:
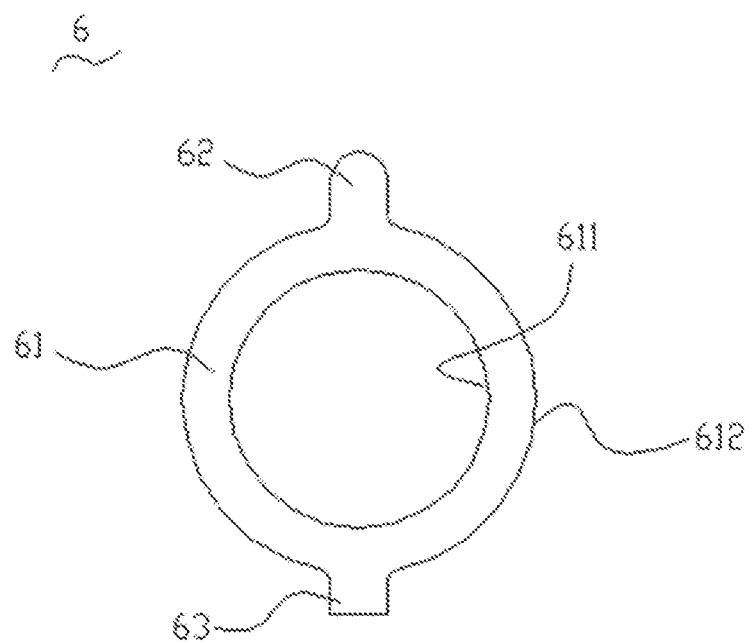
FIG. 9A is a front view of a spring tab of a carrying clip for an electronic device according to a fourth preferred embodiment of the present disclosure.
Figure 9B:
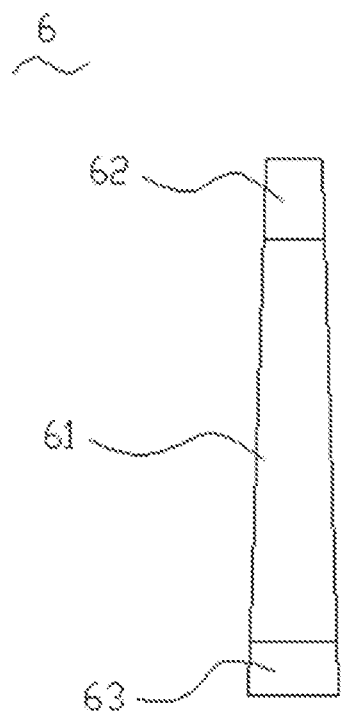
FIG. 9B is a side view of the spring tab of the carrying clip for an electronic device according to the fourth preferred embodiment of present disclosure.

As shown in FIG. 9A and FIG. 9B, FIG. 9A is a front view of the spring tab 6, FIG. 9B is a side view of the spring tab 6, the inner wall surface 611 and the outer wall surface 612 of the spring tab body 61 are a homocentric circular ring, and the thickness of the spring tab body 61 becomes thinner uniformly from the part keeping away from the protrusion 62 to the part close to the protrusion 62 along the surface width direction of the inner wall surface 611 or the outer wall surface 612 of the spring tab body 61. In order to guarantee the consistency of the entire appearance of the spring tab 6, the protrusion part 62 on the spring tab 6 is also in the structure with gradually changed thickness, a root part of the protrusion 62 connected to the spring tab body 61 becomes thinner to the direction of outer end, and similarly, regarding to other structures arranged on the spring tab body 61, for example, the limiting block 63 arranged at a relative side of the protrusion 62 is also in the structure with gradually change thickness, which continues the change trend of the thickness of the spring tab body 61 to uniformly become thicker from the root position of the limiting block 63 connected to the spring tab body 61 to the direction of outer end. Similarly, the structure of the spring tab of the embodiment can also enable the part of the spring tab 6 close to the protrusion 62 to deform more easily, and it is easier for the user to rotate.

It should be noted that the solution that the material thickness of the part of the spring tab body 61 close to the protrusion 62 becomes thinner uniformly from far to near according to the distance between the spring tab body 61 and the protrusion 62 above is only a preferred embodiment of the present disclosure instead of limiting by the solution, and during actual application, since the spring tab body 61 is made of elastic plastic materials, in spite of uniform material thickness of the spring tab body 61, the requirement of the present disclosure on the elastic deformation can be met as well. Referring to FIG. 6A, FIG. 6B and FIG. 7, and in a preferred embodiment, the non-snapping slots of the wall surface of the groove 44 are multiple sections of homocentric arc surfaces with the same diameter, the wall surfaces of all the snapping slots 441 are arc surfaces with the same size, and the arc center of the non-snapping slot of the groove 44 overlaps with the center of the spring tab body 61 and is located at a center of rotation of the first clip body 2 and the second clip body 4. Therefore, when the spring tab 6 rotates to enable the protrusion 62 to contact with any non-snapping slots of the wall surface of the groove 44, the stress is the same, so that the elasticity of the spring tab 6 is constant, and the hand feeling obtained in rotational experience by the user is also the same, and when the spring tab 6 rotates to all the snapping slot 441 positions of the groove 44, the stress is also the same, so that the hand feeling of user experience is also the same. Accordingly, when the spring tab 6 rotates and alternatively abuts against the snapping slot 441 positions or the non-snapping slots, the regular well-bedded hand feeling can be formed to improve the user experience.

Still referring to FIG. 6A, FIG. 6B and FIG. 7, a snapping slot 411 is arranged in the wall surface of the groove 44 by every 45 degrees, so that a stage is obtained at the position by every 45 degrees. In other embodiments, the quantity of the snapping slots 441 may be adjusted according to the quantity of the stages.

Figure 11:
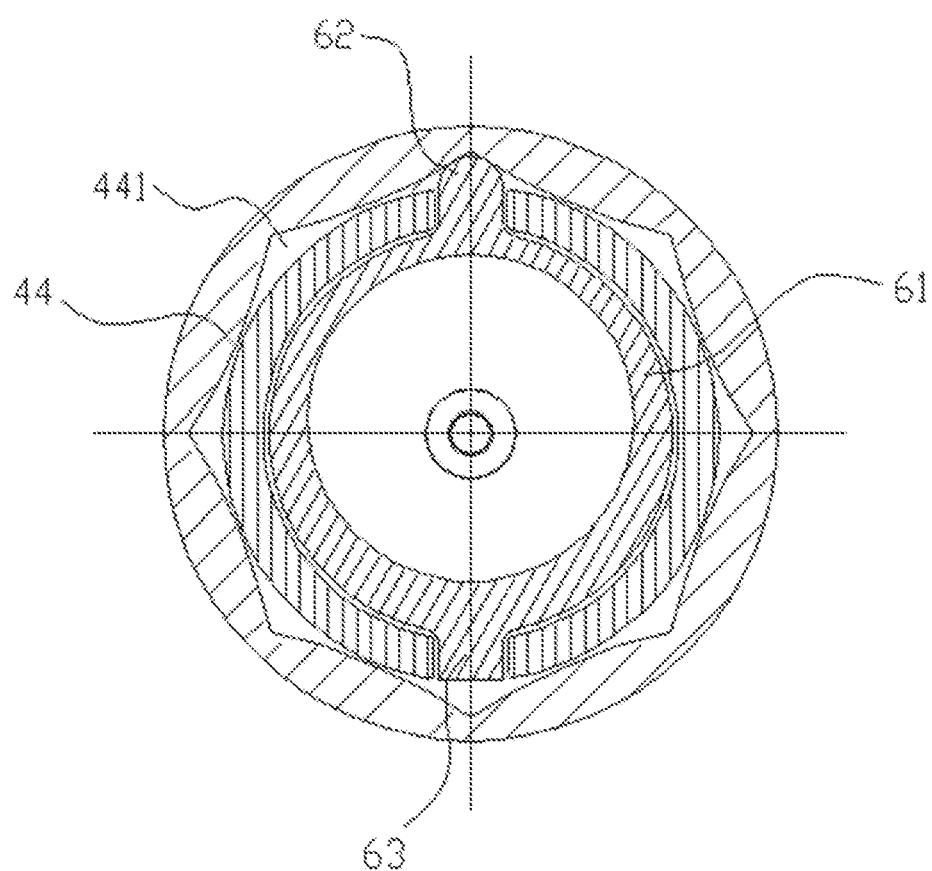
FIG. 11 is a sectional view of a spring tab matched with a snap ring and a groove of a carrying clip for an electronic device according to a sixth preferred embodiment of the present disclosure.

In another embodiment, referring to FIG. 11, the wall surface of the groove 44 may also be a polygon surface, and the wall surface where each side of the polygon surface locates is an arc surface hunching up to the center of the groove 44, and a snapping slot 441 is formed at the juncture position of two adjacent sides. It should be particularly noted that the limitation to the shapes of the wall surfaces of the groove 44 and the snapping slot 441 is only a preferred embodiment illustrated in the present disclosure, but the present disclosure is not limited to this. The wall surface of the groove 44 and the wall surface of the snapping slot 441 may be in any shape that can enable the spring tab 6 to rotate therein, and will not be illustrated one by one here.

The contents above are only preferred and feasible embodiments of the present disclosure, but are not intended to limit the protection scope of the present disclosure, and all equivalent structural changes made according to the contents of the description and drawings of the present disclosure shall fall within the protection scope of the present disclosure.

The invention claimed is:

1. A carrying clip for an electronic device, comprising:
   a first clip body provided with a snap ring on which a notch is provided;
   a second clip body rotatably connected to the first clip body and provided with a groove, wherein the snap ring of the first clip body is snapped and assembled in the groove of the second clip body and is rotatable along surface of the groove, the wall surface of the groove is uniformly formed with a plurality of snapping slots; and
   a spring tab comprising an annular spring tab body and a protrusion projected in the spring tab body, wherein the spring tab body is snapped and assembled in the snap ring of the first clip body, the protrusion projects out of the notch of the snap ring and abuts against the wall surface of the groove of the second clip body; and
   the spring tab is made of elastic plastic materials, when the first clip body rotates with respect to the second clip body, the protrusion of the spring tab rotates along the wall surface of the groove to alternatively abut against the snapping slots or non-snapping slots of the wall surface of the groove so as to form stages.

2. The carrying clip for an electronic device according to claim 1, wherein a material thickness of a part of the spring tab body close to the protrusion becomes thinner uniformly from far to near according to a distance between the spring tab body and the protrusion.

3. The carrying clip for an electronic device according to claim 1, wherein the spring tab body is an eccentric strap, both an inner wall surface and an outer wall surface of the spring tab body are circular, and a circular center of the inner wall surface deviates from a circular center of the outer wall surface to a direction close to the protrusion, and is located at a connecting line between the circular center of the outer wall surface and a center of the protrusion.

4. The carrying clip for an electronic device according to claim 3, wherein an eccentricity ratio of the spring tab body is within a range of 2%-10%.

5. The carrying clip for an electronic device according to claim 1, wherein an outer wall surface of the spring tab body is a circular surface, a half wall surface of an inner wall surface of the spring tab body close to the protrusion is an oval wall surface, a half wall surface keeping away from the protrusion is a circular wall surface, and the oval wall surface of the inner wall surface and the circular wall surface are in smooth transition.

6. The carrying clip for an electronic device according to claim 1, wherein an inner wall surface and an outer wall surface of the spring tab body are both oval surfaces, a center of the inner wall surface deviates from a center of the outer wall surface to a direction close to the protrusion, and is located at a connecting line between the center of the outer wall surface and a center of the protrusion, a long axis of the outer wall surface is located at the connecting line between the center of the outer wall surface and the center of the protrusion, and a short axis of the outer wall surface is vertical to the connecting line between the center of the outer wall surface and the center of the protrusion.

7. The carrying clip for an electronic device according to claim 1, wherein an inner wall surface and an outer wall surface of the spring tab body are homocentric circular rings, and a thickness of the spring tab body becomes thinner uniformly from a part keeping away from the protrusion to a part close to the protrusion along a surface width direction of the inner wall surface or the outer wall surface of the spring tab body.

8. The carrying clip for an electronic device according to claim 1, wherein a limiting structure for limiting a relative rotation of the spring tab body and the snap ring is arranged between , a part of the spring tab body keeping away from the protrusion and the snap ring.

9. The carrying clip for an electronic device according to claim 8, wherein the limiting structure comprises a limiting groove and a limiting block which are respectively arranged between the spring tab body and the snap ring and matched with each other.

10. The carrying clip for an electronic device according to claim 9, wherein the limiting block is arranged in the spring tab body and is located at a relative position of the protrusion, the limiting groove is formed in the snap ring and is located at a relative position of the notch, and the limiting groove penetrates through the snap ring, so that the snap ring is separated into two relatively arranged arc sections by the notch and the limiting groove.

11. The carrying clip for an electronic device according to claim 1, wherein the non-snapping slots of a groove wall surface are multiple sections of homocentric arc surfaces with a same diameter, the wall surfaces of all the snapping slots are arc surfaces with a same size, and an arc center of the non-snapping slot of the groove overlaps with a center of the spring tab body and is located at a center of rotation of the first clip body and the second clip body.

12. The carrying clip for an electronic device according to claim 1, wherein the first clip body and the second clip body are both made of plastic materials.

13. The carrying clip for an electronic device according to claim 2, wherein the spring tab body is an eccentric strap, both an inner wall surface and an outer wall surface of the spring tab body are circular, and a circular center of the inner wall surface deviates from a circular center of the outer wall surface to a direction close to the protrusion, and is located at a connecting line between the circular center of the outer wall surface and a center of the protrusion.

14. The carrying clip for an electronic device according to claim 2, wherein an outer wall surface of the spring tab body is a circular surface, a half wall surface of an inner wall surface of the spring tab body close to the protrusion is an oval wall surface, a half wall surface keeping away from the protrusion is a circular wall surface, and the oval wall surface of the inner wall surface and the circular wall surface are in smooth transition.

15. The carrying clip for an electronic device according to claim 2, wherein an inner wall surface and an outer wall surface of the spring tab body are both oval surfaces, a center of the inner wall surface deviates from a center of the outer wall surface to a direction close to the protrusion, and is located at a connecting line between the center of the outer wall surface and a center of the protrusion, a long axis of the outer wall surface is located at the connecting line between the center of the outer wall surface and the center of the protrusion, and a short axis of the outer wall surface is vertical to the connecting line between the center of the outer wall surface and the center of the protrusion.

16. The carrying clip for an electronic device according to claim 2, wherein an inner wall surface and an outer wall surface of the spring tab body are homocentric circular rings, and a thickness of the spring tab body becomes thinner uniformly from a part keeping away from the protrusion to a part close to the protrusion along a surface width direction of the inner wall surface or the outer wall surface of the spring tab body.

17. The carrying clip for an electronic device according to claim 2, wherein a limiting structure for limiting a relative rotation of the spring tab body and the snap ring is arranged between a part of the spring tab body keeping away from the protrusion and the snap ring.

18. The carrying clip for an electronic device according to claim 2, wherein the non-snapping slots of a groove wall surface are multiple sections of homocentric arc surfaces with a same diameter, the wall surfaces of all the snapping slots are arc surfaces with a same size, and an arc center of the non-snapping slot of the groove overlaps with a center of the spring tab body and is located at a center of rotation of the first clip body and the second clip body.

19. The carrying clip for an electronic device according to claim 2, wherein the first clip body and the second clip body are both made of plastic materials.

* * * * *